United States Patent

Etoh et al.

[11] 4,021,835
[45] May 3, 1977

[54] SEMICONDUCTOR DEVICE AND A METHOD FOR FABRICATING THE SAME

[75] Inventors: Jun Etoh; Toshiaki Masuhara, both of Hachioji, Japan

[73] Assignee: Hitachi, Ltd., Japan

[22] Filed: Jan. 27, 1975

[21] Appl. No.: 544,265

[30] Foreign Application Priority Data

Jan. 25, 1974  Japan ............................... 49-10179
Jan. 25, 1974  Japan ............................... 49-10180

[52] U.S. Cl. .................... 357/23; 357/52; 357/90; 357/91
[51] Int. Cl.² .................................. H01L 29/78
[58] Field of Search ............ 357/4, 22, 23, 41, 52, 357/90, 91

[56] References Cited

UNITED STATES PATENTS 3,283,221  11/1966  Heiman ........................... 357/23
3,814,992  6/1974  Kump et al. ..................... 357/23
3,891,468  6/1975  Ito et al. ........................ 357/91

FOREIGN PATENTS OR APPLICATIONS 2,047,777  4/1971  Germany ........................... 357/23

Primary Examiner—Michael J. Lynch
Assistant Examiner—Joseph E. Clawson, Jr.
Attorney, Agent, or Firm—Craig & Antonelli

[57] ABSTRACT

A MOS-FET (Metal-Oxide-Semiconductor Field Effect Transistor) comprises a semiconductor body, source and drain regions disposed in the body at portions separated from each other, a second semiconductor region having a higher impurity concentration than that of the body, formed by ion implantation in the body between the source and drain regions, a first semiconductor region having a lower impurity concentration than that of the second semiconductor region but a higher impurity concentration than that of the body, and having an opposite conductivity type to that of the second semiconductor region, formed by ion implantation, so that the second semiconductor region is very thin, and which has a very small amount of a minute current, that is a tailing current.

2 Claims, 26 Drawing Figures

SEMICONDUCTOR DEVICE AND A METHOD FOR FABRICATING THE SAME

BACKGROUND OF THE INVENTION

1. Field of the Invention:

This invention relates to a MOSFET (Metal-Oxide-Semiconductor Field Effect Transistor), and more particularly to a MOSFET having a very small amount of minute current.

The minute current which is so called a tailing current is a drain current at the vicinity of a threshold voltage of the MOSFET, that is, from about $10^{-6}$ A to about $10^{-12}$ A.

It is generally said that, in a MOSFET, the drain current is proportional to the square of the gate voltage, but practically a minute drain current flows even when the gate voltage is lower than the threshold voltage. This minute drain current is a so-called tailing current and decreases according to the gate voltage. In the MOSFET, however, there is a phenomenon that the drain current is fixed at a certain very minute value which is called hereinafter as a residual current.

These tailing and residual currents become one of causes for errors in circuits and are fatal to devices utilizing MOSFETs. For example, in a dynamic type memory device utilizing MOSFETs, since the tailing current and the residual current easily flow between the source and drain regions of the MOSFETs even when the value of the gate voltages of the MOSFETs is lower than the threshold voltage of the MOSFETs which is usually defined by a gate voltage at a drain current of about $10^{-6}$ A, and hence charges for establishing memory functions in the memory device flow out, the memory device cannot sufficiently function. Further, these MOSFETs consume a large amount of electricity, since minute current always flows during the operation thereof.

Further, in an integrated circuit device, it has been desired to change an enhancement type MOSFET to a depletion type MOSFET or a depletion type MOSFET to an enhancement type MOSFET for reducing the steps for fabricating the integrated circuit device and a MOSFET has been proposed, wherein a semiconductor region having the same or opposite conductivity type to that of the semiconductor body of MOSFET is disposed in the body between source and drain regions. Although the threshold voltage of the MOSFET is easily changed from an inherent value of the MOSFET which is determined by the impurity concentration of the body to a desired value by disposing the semiconductor region having a desired impurity concentration, there is such a defect that the larger the difference between the inherent value and the desired value of the threshold voltage is, the larger the tailing current and the residual current become.

SUMMARY OF THE INVENTION

Therefore, an object of the present invention is to provide a MOSFET having a very small amount of minute current.

Another object of the present invention is to provide a MOSFET having a threshold voltage whose value is different from an initial value of a MOSFET which is determined by the impurity concentration of a semiconductor body of the MOSFET, and having a very small amount of tailing current and residual current.

A further object of the present invention is to provide a method for efficiently fabricating a MOSFET having a different threshold voltage from that which is determined by the impurity concentration of a semiconductor body of the MOSFET and having a very small amount of tailing current and residual current.

These objects of the present invention are attained by providing a first semiconductor region having a higher impurity concentration than that of the semiconductor body for the MOSFET, disposed within the body between the source and drain regions, and a second semiconductor region having an opposite conductivity type to that of the first semiconductor region, disposed in the body between the source and drain regions and directly upon the first semiconductor region.

The additional objects and advantages of the present invention will become apparent from the following description which is taken in conjunction with the accompanying drawings:

Before explaining the present invention, the background of the minute current will be explained hereinafter according to conventional MOSFETs.

BACKGROUND OF THE INVENTION

Figure 1:
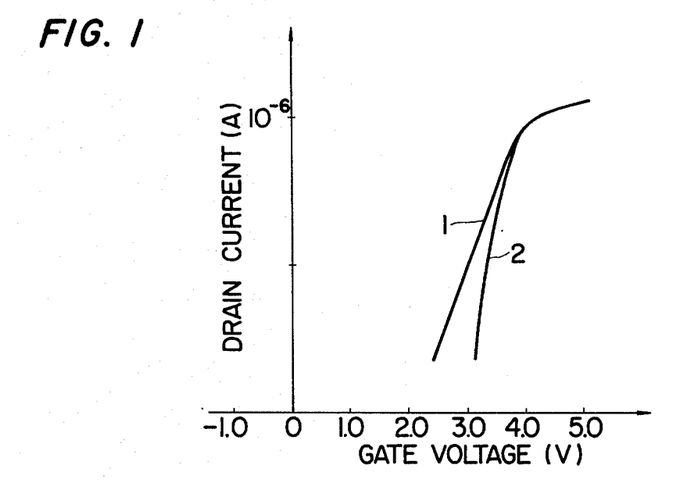
FIG. 1 is a graph showing the relationship between drain current and gate voltage for explaining tailing current.

In FIG. 1, the relationship between drain current ($I_D$) and a gate voltage ($V_G$) is shown as a logarithmic drain current (log $I_D$) vs the gate voltage ($V_G$). The gate voltage at a drain current of about $10^{-6}$A is usually defined as the threshold voltage of a MOSFET. As is apparent from FIG. 1, the curve of the logarithmic drain current vs. the gate voltage $V_G$ is linear below the drain current of about $10^{-6}$ A. When this linear part of the curve is assumed to be indicative of the tailing current, it should be noted that a MOSFET having a curve 2 of the logarithmic drain current vs. the gate voltage relationship shown in FIG. 1 has a larger tailing current inclination than that of MOSFET having a curve 1 of the logarithmic drain current vs. the gate voltage relationship shown in FIG. 1. Further, in MOSFETs having the same threshold voltage, the MOSFET having a larger tailing current inclination has a lower tailing current than that of the MOSFET having a smaller tailing current inclination. Therefore, the MOSFET having the curve 2 in FIG. 1 has the lower tailing current than that of the MOSFET having the curve 1 in FIG. 1.

As stated above, it is preferred for MOSFETs that the tailing current be as low as possible.

Figure 2:
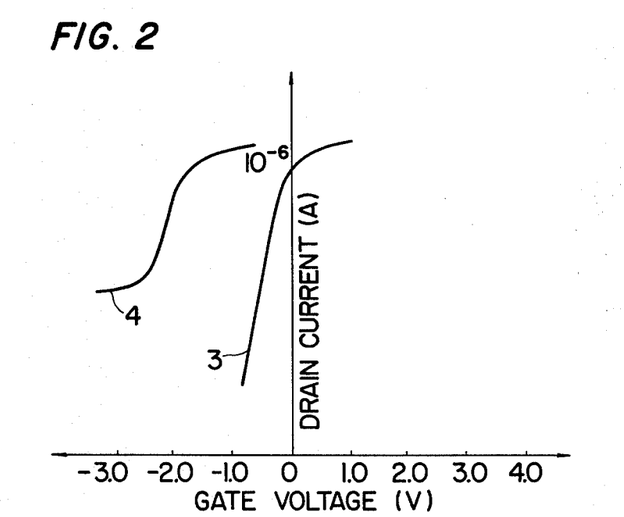
FIG. 2 is a graph showing the relationship between drain current and gate voltage for explaining residual current.

FIG. 2 is another graph showing the relationship between the drain current and the gate voltage for explaining residual current. In FIG. 2, the relationship is shown as a logarithmic drain current vs. gate voltage. As stated in the explanation for FIG. 1, the gate voltage at the drain current of about $10^{-6}$ A is defined as the threshold voltage of MOSFET and the curve of the logarithmic drain current vs the gate voltage becomes linear below a drain current of about $10^{-6}$A as is the curve 3 in FIG. 2. In addition to this tailing current, in MOSFETs, the drain current is fixed at a certain very minute value as shown in FIG. 2, as in curve 4. The drain current fixed at a certain very minute value is called the residual current.

In integrated circuit devices utilizing MOSFETs, it has been strongly desired to change threshold voltages of the MOSFETs, since it is very useful for integrated circuit devices to have both types of MOSFETs, that is, enhancement type MOSFETs and depletion type MOSFETs in a common semiconductor body.

Since, for an enhancement type MOSFET the threshold voltage $V_T$ should be negative ($V_T<0$) in a p-channel MOSFET and the threshold voltage $V_T$ should be positive ($V_T<0$ ) in an n-channel MOSFET, when an $SiO_2$ layer (which is commonly employed as the insulating material in the semiconductor field) is utilized for the gate insulating layer, the threshold voltage becomes negative in n-channel MOSFET, and hence the above mentioned condition cannot be accomplished. In other words, an enhancement type n-channel MOSFET cannot be obtained by utilizing an $SiO_2$ layer as the gate insulating layer. Therefore, the threshold voltage must be changed.

For changing the threshold voltage, it has been proposed to utilize different insulating materials as the gate insulating layer, for example, aluminum oxide may be used for the enhancement type n-channel MOSFETs and for the depletion type p-channel MOSFETs and silicon oxide may be used for the depletion type n-channel MOSFETs and for the enhancement type p-channel MOSFETs.

This proposal, however, complicates the fabrication of an integrated circuit device utilizing MOSFETs, since different insulating materials must be utilized at different portions and also the thicknesses of the insulating materials must be accurately controlled.

DESCRIPTION OF THE PRIOR ART

This complication has been improved by utilizing a method described in Applied Physics Letters, Vol. 18, No. 11,(June, 1971) p. 502. This method is fundamentally to form a semiconductor region having a different impurity concentration than that of the semiconductor body in the body between source and drain regions.

Figure 3:
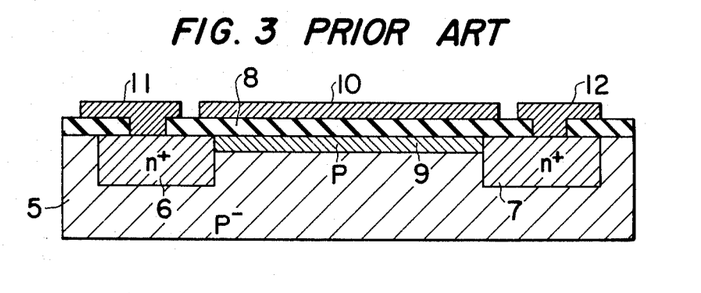
FIG. 3 is a longitudinal sectional view of a conventional MOSFET.
Figure 4:
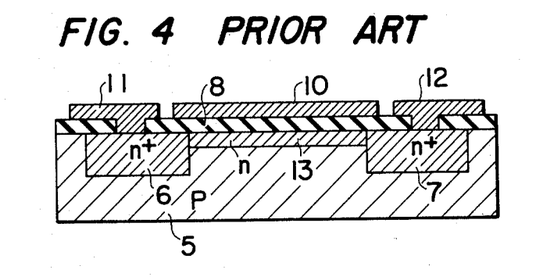
FIG. 4 is a longitudinal sectional view of another conventional MOSFET.

Typical examples of this technique are shown in FIG. 3 and 4.

FIG. 3 is a longitudinal sectional view of an n-channel MOSFET, whose threshold voltage is changed to a positive level, so as to function as an enhancement type n-channel MOSFET, which comprises a p-type semiconductor body 5, source and drain regions 6 and 7 having an $n$ conductivity type, disposed in different portions of the body 5, a gate insulating layer 8 of $SiO_2$ disposed on the surface of the body 5 between the source and drain regions 6 and 7, a semiconductor region 9 of a $p$ conductivity type having an impurity concentration higher than that of the body 5, disposed in the body 5 between the source and drain regions 6 and 7, a gate electrode 10 disposed on the gate insulating layer 8, and source and drain electrodes 11 and 12 connected respectively to the source region 6 and the drain region 7.

FIG. 4 is a longitudinal sectional view of another n-channel MOSFET, whose threshold voltage is changed to a negative level, so as to function as a depletion type n-channel MOSFET which comprises a p-type semiconductor body 5, source and drain regions 6 and 7 having an $n$ conductivity type, disposed in different portions of the body, a gate insulating layer 8 of $SiO_2$ disposed on the surface of the body 5 between the source and drain regions 6 and 7, a semiconductor region 13 of an $n$ conductivity type having an impurity concentration higher than that of the body 5, disposed in the body 5 between the source and drain regions 6 and 7, a gate electrode 10 disposed on the gate insulating layer 8, and source and drain electrodes 11 and 12 connected respectively to the source region 6 and the drain region 7.

Figure 5:
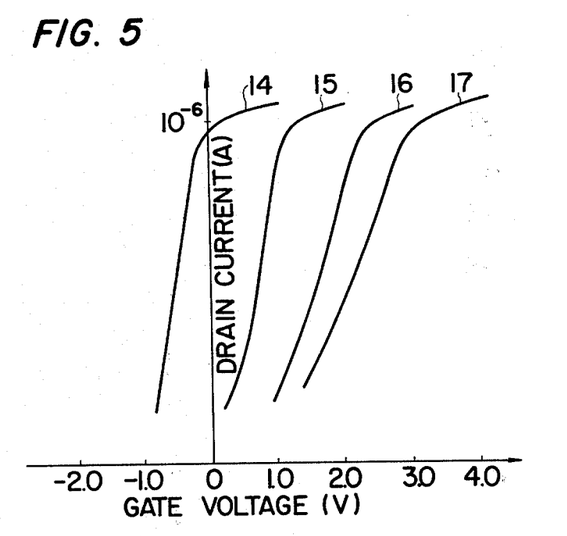
FIG. 5 is a graph showing relationships between drain current and gate voltage obtained according to the conventional MOSFETs shown in FIG. 3.
Figure 6:
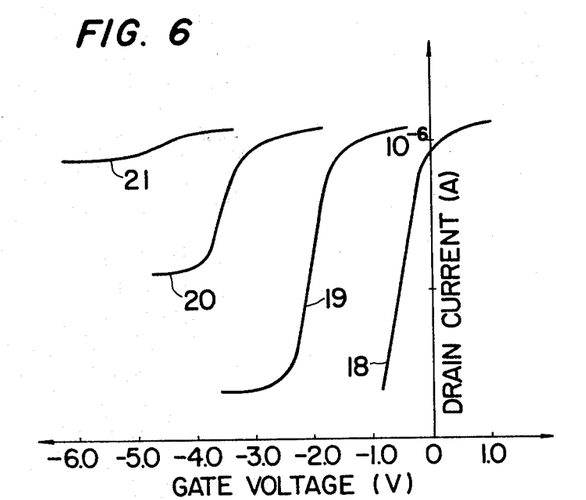
FIG. 6 is a graph showing relationships between drain current and gate voltage obtained according to the conventional MOSFETs shown in FIG. 4.

According to these devices shown in FIGS. 3 and 4, threshold voltages are easily changed as shown in FIGS. 5 and 6 which are graphs showing relationships between the drain current and the gate voltage.

In FIG. 5, reference numeral 14 is a curve for a MOSFET shown in FIG. 3 wherein the p-type semiconductor region 9 is not disposed between the source and drain regions 6 and 7, and reference numerals 15, 16 and 17 are curves for MOSFETs shown in FIG. 3, wherein the impurity concentrations in the semiconductor region 9 are different each other. The curve 16 is for a MOSFET in FIG. 3, wherein the p-type semiconductor region 9 has a higher impurity concentration than that of the p-type semiconductor region 9 of another MOSFET having curve 15, and the curve 17 is for MOSFET in FIG. 3, wherein the p-type semiconductor region 9 has a higher impurity concentration than that of the p-type semiconductor region of the MOSFET having the curve 16.

As is apparent from FIG. 5, the larger the change of the threshold voltage, the more the tailing current increases.

In FIG. 6, reference numeral 18 is a curve for a MOSFET of FIG. 4, wherein the n-type semiconductor region 13 is not disposed between the source and drain regions 6 and 7, and reference numerals 19, 20, and 21 are curves for MOSFETs shown in FIG. 4 wherein the impurity concentrations in the n-type semiconductor region 13 are different from each other. The curve 20 is for a MOSFET wherein the n-type semiconductor region 13 has a higher impurity concentration than that of the n-type semiconductor region of another MOSFET having the curve 19, and the curve 21 is obtained by MOSFET wherein the n-type semiconductor region 13 has a higher impurity concentration than that of the n-type semiconductor region of the MOSFET having the curve 20.

As is apparent from FIG. 6, the larger the change of the threshold voltage, the more the residual current increases.

According to the present invention, the tailing current and the residual current are maintained to values very close to those which are determined by the semiconductor body.

DETAILED DESCRIPTION OF THE INVENTION

Figure 7:
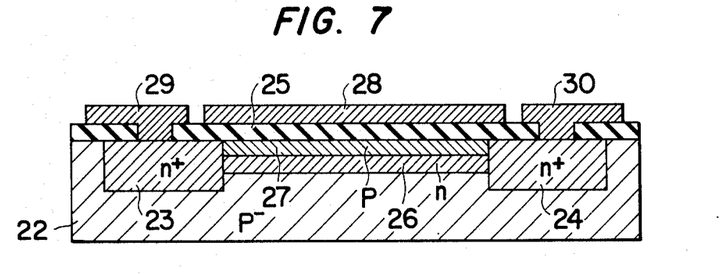
FIG. 7 is a longitudinal sectional view illustrating one embodiment of the present invention.

FIG. 7 is a longitudinal sectional view of one embodiment of the present invention, which comprises a semiconductor body 22 of a p-conductivity type, having an impurity concentration of $5.9 \times 10^{14}$ cm$^{-3}$, a source region 23 of an n-conductivity type disposed in body 22, a drain region of the n-conductivity type disposed in body 22 at a portion different from that at which source region 23 is disposed, a gate insulating layer 25 of SiO$_2$ disposed on the surface of the body 22 between the source and drain regions 23 and 24, a first semiconductor region 26 of N-conductivity type, having an impurity concentration of $2.1 \times 10^{15}$ cm$^{-3}$ disposed within body 22 between the source and drain regions 23 and 24, and which has a thickness of about 400A, a second semiconductor region 27 of p-conductivity type, having an impurity concentration of $2.1 \times 10^{17}$ cm$^{-3}$, disposed in body 22 between the source and drain regions 23 and 24 and directly upon the first semiconductor region 27, and which has a thickness of about 800A, a gate electrode 28 disposed on the gate insulating layer 25, and source and drain electrodes 29 and 30 connected to the source and drain regions 23 and 24, respectively.

Figure 8:
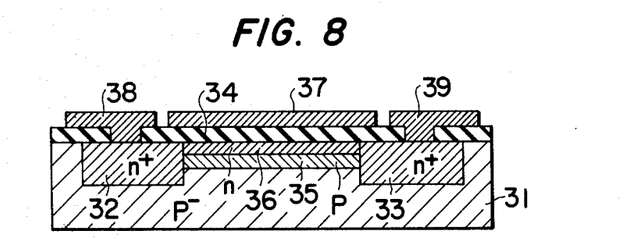
FIG. 8 is a longitudinal sectional view illustrating another embodiment of the present invention.

FIG. 8 is a longitudinal sectional view of another embodiment of the present invention, which comprises a semiconductor body 31 of a p-conductivity type, having an impurity concentration of $5.9 \times 10^{14}$ cm$^{-3}$, a source region 32 of an n-conductivity type disposed in body 32, a drain region of a n-conductivity type disposed in said body 31 at a portion different from that at which said source region 32 is disposed, a gate insulating layer 34 of SiO$_2$ disposed on the surface of the body 31 between the source and drain regions 32 and 33, a first semiconductor region 35 of p-conductivity type, having an impurity concentration of $5.8 \times 10^{16}$ cm$^{-3}$, disposed within body 31 between the source and drain regions 32 and 33, and which has a thickness of about 1000 A, a second semiconductor region 36 of n-conductivity type, having an impurity concentration of $1.9 \times 10^{17}$ cm$^{-3}$, disposed in body 31 between the source and drain regions 32 and 33 and directly upon the first semiconductor region 35, and which has a thickness of about 800 A, a gate electrode 37 disposed on the gate insulating layer 34, and source and drain electrodes 38 and 39 connected to the source and drain regions 32 and 33, respectively.

Figures 9, 10:
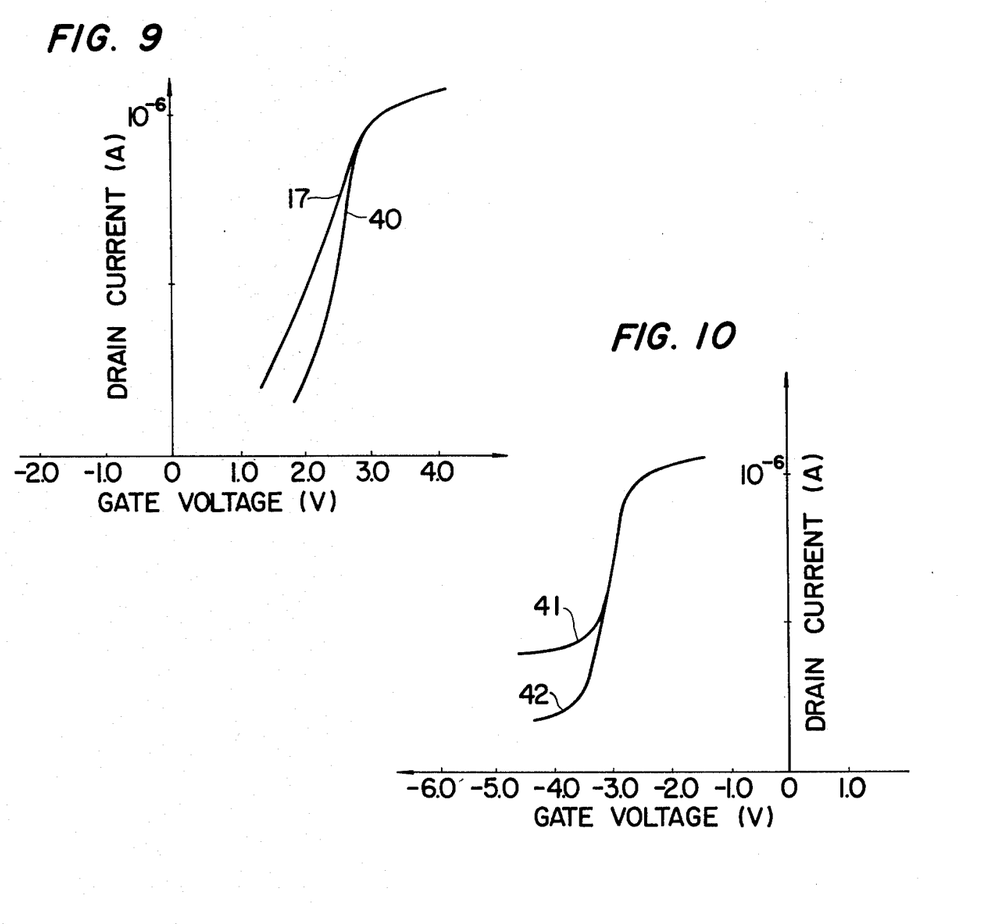
FIG. 9 is a graph showing relationships between drain current and gate voltage for explaining the effect of the present invention.
FIG. 10 is a graph showing relationships between drain current and gate voltage for explaining another effect of the present invention.

FIGS. 9 and 10 are graphs showing the relationships between drain currents and gate voltages of the MOSFETs shown in FIGS. 7 and 8, respectively.

In FIG. 9, reference numeral 17 is a curve obtained by a MOSFET having the structure shown in FIG. 3, wherein the p-type semiconductor region 9 has an impurity concentration of $1.3 \times 10^{17}$ cm$^{-3}$ and a reference numeral 40 is a curve obtained by MOSFET shown in FIG. 7, that is, one embodiment of the present invention.

As is apparent from FIG. 9, the tailing current of the present invention is lower than that of the MOSFET shown in FIG. 3. In other words, according to the present invention, the tailing current is maintained very low even when the threshold voltage is changed from that determined by the impurity concentration of the semiconductor body, when compared with the conventional MOSFET shown in FIG. 3.

In FIG. 10 reference numeral 41 is a curve obtained by MOSFET having the structure shown in FIG. 4, wherein the n-type semiconductor region 13 has an impurity concentration of $1 \times 10^{17}$ cm$^{-3}$ and a reference numeral 42 is a curve obtained by a MOSFET shown in FIG. 8, that is another embodiment of the present invention.

As is apparent from FIG. 10, the residual current of the present invention is lower than that of the MOSFET shown in FIG. 4. In other words, according to the present invention, the residual current is maintained very low even when the threshold voltage is changed from that determined by the impurity concentration of the semiconductor body, when compared with the conventional MOSFET shown in FIG. 4.

Although preferred embodiments have been described hereinabove, the present invention is not limited to these embodiments. The gist of the present invention is, as stated before, to provide a first semiconductor region having a higher impurity concentration than that of the semiconductor body for the MOSFET, disposed within the body between source and drain regions, and a second semiconductor region having an opposite conductivity type to that of the first semiconductor region disposed in the body between the source and drain regions and directly upon the first semiconductor region. These first and second semiconductor regions, however, have preferable ranges of impurity concentration and the thickness. These preferable ranges are shown in FIGS. 11a, 11b, 12a and 12b.

Figure 11A:
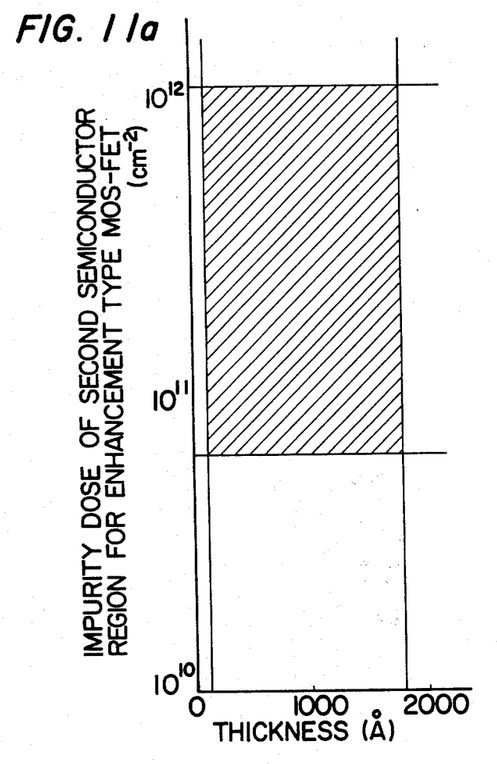
FIGS. 11a and 11b show preferable ranges of impurity concentrations and thicknesses for second and first semiconductor regions of an enhancement type MOSFET, such as shown in FIG. 7, respectively.
Figure 11B:
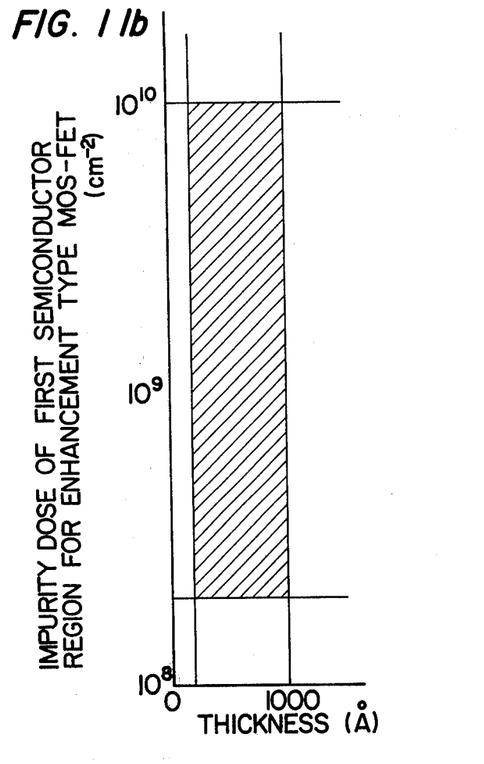

FIGS. 11a and 11b show preferable ranges of impurity concentrations and thicknesses for the second and first semiconductor regions of the enhancement type MOSFET, such as shown in FIG. 7, respectively.

As is apparent from FIGS. 11a and 11b, it is preferable that the impurity dose (one of the expressions for the amount of impurities; impurity dose is defined by a quantity obtained by integrating the impurity concentration over range of a thickness.) and the thickness of the second semiconductor region is in a range of between $6.6 \times 10^{10}$ cm$^{-2}$ and $1.2 \times 10^{12}$ cm$^{-2}$, and in a range of between 100 A and 1800A respectively, and that the impurity dose and the thickness of the first semiconductor region is in a range of between $2 \times 10^8$ cm$^{-2}$ and $1 \times 10^{10}$ cm$^{-2}$, and in the range of between 200 A and 1000 A, respectively.

Figure 12A:
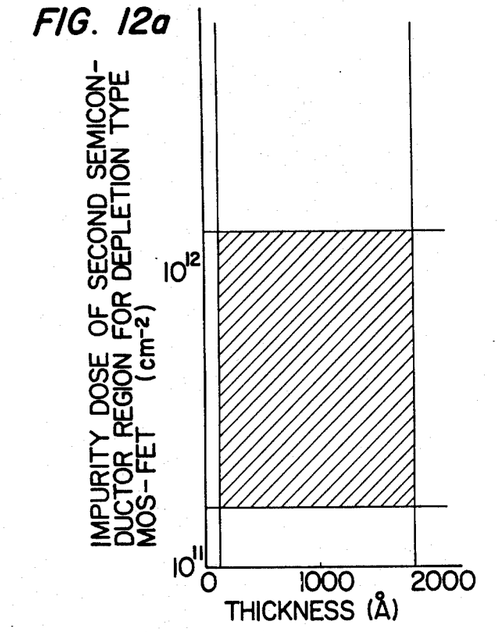
FIGS. 12a and 12b show preferable ranges of impurity concentrations and thicknesses for second and first semiconductor regions of a depletion type MOSFET, such as shown in FIG. 8, respectively.
Figure 12B:
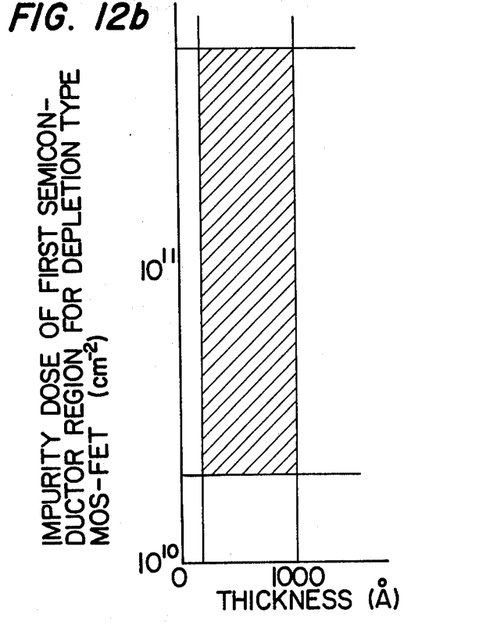

FIGS. 12a and 12b show preferable ranges of impurity concentrations and thicknesses for the second and first semiconductor regions of the depletion type MOSFET, such as shown in FIG. 8, respectively.

As is apparetn from FIGS. 12a and 12b, it is preferable that the impurity dose and the thickness of the second semiconductor region be in a range of between $1.6 \times 10^{11}$ cm$^{-2}$ and $1.4 \times 10^{12}$ cm$^{-2}$ and in a range of between 100A and 1800 A, respectively, and that the impurity dose and the thickness of the first semiconductor region be in a range of between $2 \times 10^{10}$ cm$^{-2}$ and $5.8 \times 10^{11}$ cm$^{-2}$, and in a range of between 200 A and 1000 A, respectively.

These ranges were determined by the inventors according to their experiments. For example, the range of the impurity concentration was determined by the reason that MOSFETs which do not have any semiconductor regions except the semiconductor body between source and drain regions usually have a threshold voltage of between $-0.2$ V and 30 0.2 V, and hence at least $+0.2$ V should be shifted for obtaining enhancement type MOSFETs and more than $-0.2$V should be shifted for obtaining depletion type MOSFETs; and that, in both of the enhancement type MOSFETs and the depletion type MOSFETs, it is preferable to havenot so high threshold voltages, that is a range between $\pm 4$V, since it is required for MOSFETs to be operated within a range of low threshold voltages.

These MOSFETs of the present invention are fabricated by utilizing conventional ion implantation techniques. The method comprises the steps of preparing a semiconductor body; forming a semiconductor region having an opposite conductivity type to that of the body in the body, which functions as a source region of the MOSFET; forming another semiconductor region havin an opposite conductivity type to that of the body in the body at a portion different from that at which the source region is formed, which functions as a drain region of the MOSFET; forming a gate insulating layer on the surface of the body between the source and drain regions; implanting second ions in the body between the source and drain regions for forming a second semiconductor region; implanting first ions which are dopants opposite to said ions for forming the second semiconductor regions in the body between the source and drain regions with an energy such that a projected range thereof is larger than that of the second ions, whereby a first semiconductor region is formed within the body; forming a gate electrode on the insulating layer; and forming source and drain electrodes on the surfaces of the source region and of the drain region, espectively.

Concrete embodiments of the method of the present invention will be explained hereinafter according to FIGS. 13a–13f and 14a–14f.

FIGS. 13a–13f illustrate the manufacturing process of the enhancement type MOSFET, such as the MOSFET shown in FIG. 7.

Figure 13A:
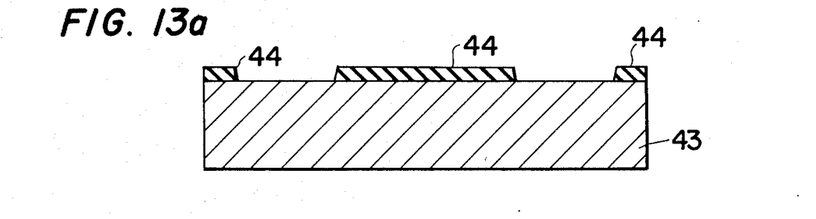
FIGS. 13a–13f are drawings for explaining the manufacturing process of the enhancement type MOSFET of the present invention.

On a surface of a semiconductor body 43 of a p-conductivity type Si, having an impurity concentration of $5.9 \times 10^{14}$ cm$^{-3}$, an insulating layer 44 of SiO$_2$ having a thickness of 700 A is formed, and then predetermined portions of the SiO$_2$ layer 44 are etched for forming through holes, as shown in FIG. 13a.

Figure 13B:
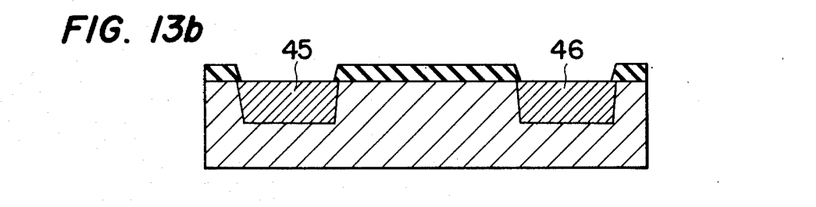

This resultant device is introduced into a diffusion furnace (not shown), and then is heat treated in POCl$_3$ gas at a temperature of about 1000° C for about 5 minutes for forming a source region 45 and a drain region 46 as shown in FIG. 13b.

The SiO$_2$ layer 44 is removed from the surface of the body 43 and a fresh insulating layer 47 of the SiO$_2$ having a thickness of about 700 A is formed on the surface of the body 43.

Figure 13C:
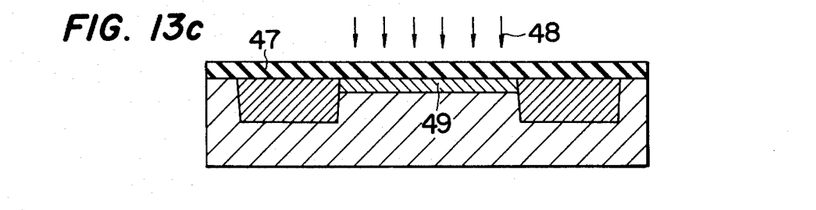

Then, boron ions 48 are implanted in the body 43 between the source and drain regions 45 and 46 with an ion energy of about 30KeV, that is, a projected range of about 390A from the surface of the body 43 and a total amount of implanting ions of about $6 \times 10^{12}$ cm$^{-2}$ for forming a second semiconductor region 49 of p-conductivity type (FIG.13C).

Figure 13D:
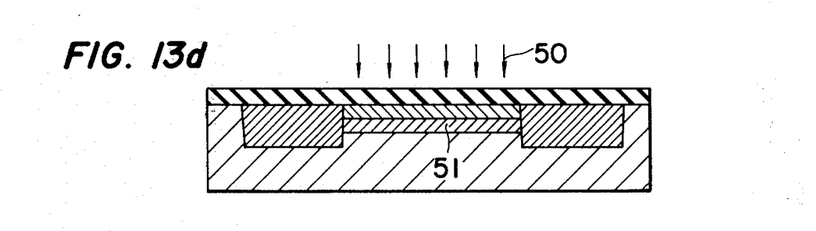

Next, phosphorus ions 50 are implanted within the body 43 between the source and drain regions 45 and 46 with an ion energy of about 110 KeV, that is, a projected range of about 537 A from the surface of the body 43 and a total amount of implanting ions of about $4.2 \times 10^{12}$ cm$^{-2}$, for forming a first semiconductor region 51 of n-conductivity type (FIG. 13d).

Figure 13E:
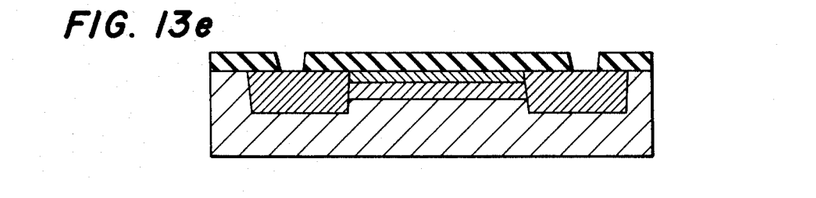
Figure 13F:
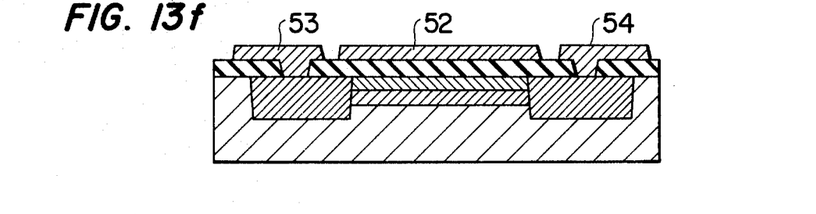

This resultant device is then introduced into an electric furnace (not shown), and is heat treated at a temperature of about 950° C for about 30 minutes in an atmosphere of N$_2$. After that, predetermined portions of the SiO$_2$ layer 47, that is, portions corresponding to the source and drain regions 45 and 46 are etched, as shown in FIG. 13E and then a gate electrode 52, a source electrode 53, and a drain electrode 54 are formed on the part of the SiO$_2$ layer 47 corresponding to the part between the source and drain regions 45 and 46, on the surface of the source region 45 and on the surface of the drawing region 46, respectively, as shown in FIG. 13f.

FIGS. 14a–14f are drawings for explaining the manufacturing process of the depletion type MOSFET, such as the MOSFET shown in FIG. 8, of the present invention.

Figure 14A:
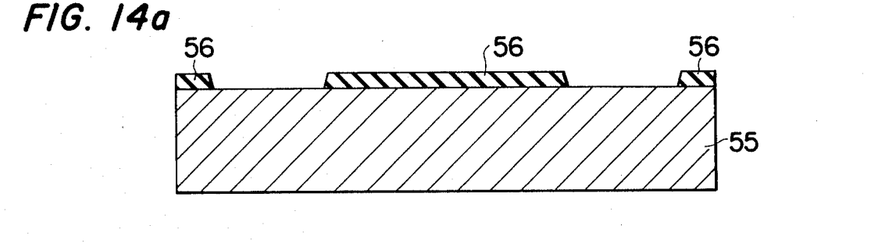
FIGS. 14a–14f are drawings for explaining the manufacturing process of the depletion type MOSFET of the present invention.

On a surface of a semiconductor body 55, of a p-conductivity type Si, having an impurity concentration of $5.9 \times 10^{14}$ cm$^{-3}$, an insulating layer 56 of SiO$_2$ having a thickness of about 700 A is formed, and then predetermined portions of the SiO$_2$ layer 56 are etched off, for forming through holes as shown in FIG. 14a.

Figure 14B:
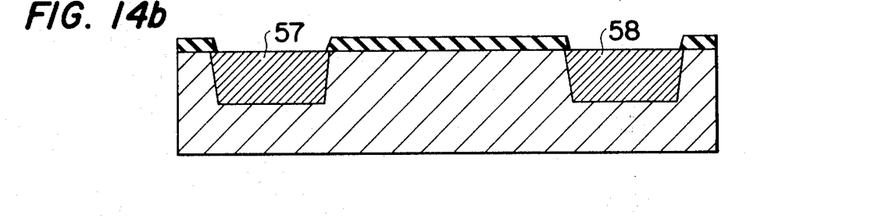

This resultant device is introduced into a diffusion furnace (not shown), and is heat treated in POCl$_3$ gas at a temperature of about 1000° C for about 5 minutes for forming a source region 57 and a drain region 58. (FIG. 14b).

Figure 14C:
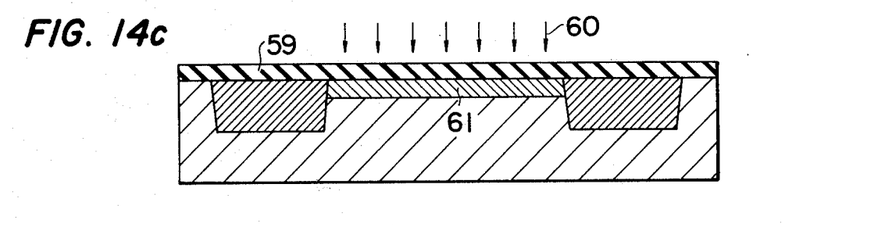

The SiO$_2$ layer 56 is removed from the surface of the body 55 and a fresh insulating layer 59 of SiO$_2$ having a thickness of about 700A if formed on the surface of the body 55 by heat treating the body 55 in an oxygen atmosphere at a temperature of 1045° C for 45 minutes Then phosphorus ions 60 are implanted in the body 55 between the source and drain regions 57 and 58 with an ion energy of about 100 KeV, that is, a projected range of about 410 A from the surface of the body 55 and a total amount of implanting ions of about $1.76 \times 10^{12}$ cm$^{-2}$, for forming a second semiconductor region 61 of n-conductivity type (FIG.14c).

Figure 14D:
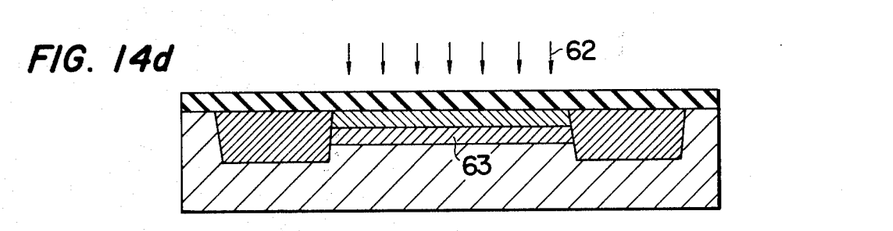

Next, boron ions 62 are implanted within the body 55 between the source and drain regions 57 and 58 with an ion energy of about 35 KeV, that is, a projected range of about 600 A from the surface of the body 55 and a total amount of implanting ions of about $8.8 \times 10^{11}$ cm$^{-2}$ for forming a first semiconductor region 63 of p-conductivity type (FIG. 14d)

Figure 14E:
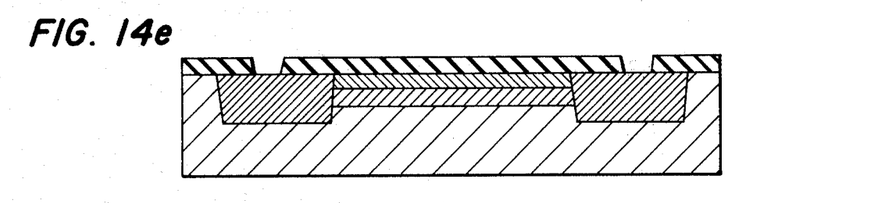
Figure 14F:
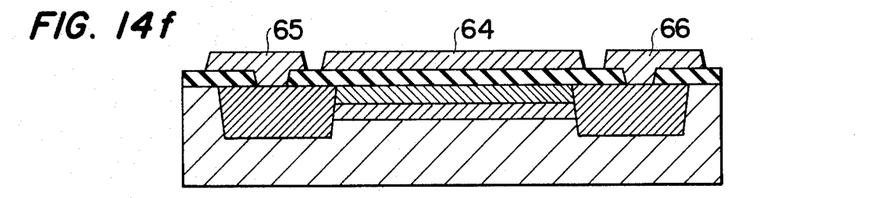

This resultant device is introduced into an electrical furnace (not shown) and is heat treated at a temperature of about 1000° C for about 5 minutes, in an atmosphere of $N_2$. After that predetermined portions of the $SiO_2$ layer 59, that is, portions corresponding to the source and drain regions 57 and 58 are etched as shown in FIG 14e, and then a gate electrode 64, a source electrode 65 and a drain electrode 66 are formed on the part of the $SiO_2$ layer 59 corresponding to a part between the source and drain regions 57 and 58, on the surface of the source region 57 and on the surface of the drain region 58, respectively, as shown in FIG. 14f.

Although the preferred embodiments of the method for fabricating MOSFETs of the present invention have been described above, the present invention is not limited to these embodiments.

For example, although boron and phosphorus ions were utilized for forming the first and second semiconductor regions, as is well known in the art that ions of other materials for obtaining semiconductor regions having a desired conductivity type may be utilized.

Further, although, in the embodiments of the energy of the ions and the total amount of implanting ions for forming the first semiconductor regions were 110 KeV and $4.2 \times 10^{12}$ cm$^{-2}$ for the enhancement type MOSFET and 35 KeV and $8.8 \times 10^{11}$ cm$^{-2}$ for the depletion type MOSFET, respectively, and the energy of ions and the total amount of implanting ions for forming the second semiconductor regions were 30 KeV and $6 \times 10^{12}$ cm$^{-2}$ for the enhancement type MOSFET and 100 KeV and $1.76 \times 10^{12}$ cm$^{-2}$ for the depletion type MOSFET, respectively, the energy of ions may be changed to such that the projected range of ions for forming the first semiconductor region is larger than that of the ions for forming the second semiconductor region, and the total amount of implanting ions may be changed to such that the impurity concentration of the second semiconductor region is higher than that of the first semiconductor region.

Preferable projected ranges of ions for the second semiconductor region and for the first semiconductor region are smaller than about 400 A from the surface of the body and smaller than about 500 A from the surface of the body respectively, and preferable ranges of total amount of implanting ions for the second semiconductor region and the first semiconductor region are between $5 \times 10^{11}$ cm$^{-2}$ and $6 \times 10^{12}$ cm$^{-2}$, and $2.5 \times 10^{11}$ cm$^{-2}$ and $4.2 \times 10^{12}$ cm$^{-2}$ for the enhancement type MOSFET, and $5 \times 10^{11}$ cm$^{-2}$ and $3 \times 10^{12}$ cm$^{-2}$ and $2.5 \times 10^{11}$ cm$^{-2}$ and $2.1 \times 10^{12}$ cm$^{-2}$ for the depletion type MOSFET.

Further, although, in the above embodiments, concrete annealing conditions after the steps of implanting ions for forming the first and second semiconductor regions are described, any conventional annealing conditions may be employed.

Although, the present invention has been explained in detail according to the preferred embodiments which are n-channel MOSFETs, it will be easily understood that the present invention is applicable to p-channel MOSFETs by reversing the conductivity types of the semiconductor body, the source and drain regions, and the first and second semiconductor regions.

While the present invention has been shown and described in terms of the best mode contemplated for carrying out the invention, it will be appreciated that changes and modifications can be made which do not depart from the inventive concepts taught herein. Such changes and modifications are deemed to be within the purview of the present invention.

We claim:
1. A semiconductor device comprising:
a semiconductor body having one of $p$ and $n$ conductivity types;
a source region of an opposite conductivity type to that of said semiconductor body, disposed in a first surface portion of said semiconductor body;
a drain region of the same conductivity type as that of said source region, disposed in a second surface portion of said semiconductor body, spaced spart from said first surface portion of said semiconductor body in which said source region is disposed;
a first semiconductor region, whose conductivity type is opposite to that of said semiconductor body, whose impurity concentration is higher than that of said semiconductor body and whose impurity dosage is within a range between $2 \times 10^8$ cm$^{-2}$ and $1 \times 10^{10}$ cm$^{-2}$, disposed within said semiconductor body between said source and drain regions;
a second semiconductor region whose conductivity type is opposite to that of said first semiconductor region, whose impurity concentration is higher than that of said first semiconductor region and whose impurity dosage is within a range between $6.6 \times 10^{10}$ cm$^{-2}$ and $1.2 \times 10^{12}$ cm$^{-2}$, disposed in said semiconductor body between said source and drain regions and directly upon said first semiconductor region;
an insulating layer disposed on the surface of said semiconductor body between said source and drain regions;
a gate electrode disposed on said insulating layer; and
electrodes connected to said source and drain regions, respectively.

2. A semiconductor device according to claim 1, wherein the first and second semiconductor regions have thicknesses within ranges between 200 A and 1000 A, and 100 A and 1800 A, respectively.

* * * * *